(12) United States Patent
Matsumura et al.

(10) Patent No.: US 9,745,498 B2
(45) Date of Patent: Aug. 29, 2017

(54) HEAT-STORAGE COMPOSITION

(71) Applicants: Fuji Polymer Industries Co., Ltd., Nagoya-shi, Aichi (JP); RIKEN, Wako-shi, Saitama (JP)

(72) Inventors: Tomoki Matsumura, Aichi (JP); Masakazu Hattori, Aichi (JP); Seiji Niitaka, Saitama (JP); Kimitoshi Kono, Saitama (JP)

(73) Assignees: Fuji Polymer Industries Co., Ltd., Aichi (JP); RIKEN, Saitama (JP)

( * ) Notice: Subject to any disclaimer, the term of this patent is extended or adjusted under 35 U.S.C. 154(b) by 0 days.

(21) Appl. No.: 14/898,701

(22) PCT Filed: Oct. 20, 2014

(86) PCT No.: PCT/JP2014/077814
§ 371 (c)(1),
(2) Date: Dec. 15, 2015

(87) PCT Pub. No.: WO2015/087620
PCT Pub. Date: Jun. 18, 2015

(65) Prior Publication Data
US 2016/0130492 A1  May 12, 2016

(30) Foreign Application Priority Data
Jun. 23, 2014  (JP) ................................. 2014-128404

(51) Int. Cl.
| C08K 3/36 | (2006.01) |
| C09K 5/06 | (2006.01) |
| C08K 3/00 | (2006.01) |
| C08L 101/00 | (2006.01) |
| C09K 5/00 | (2006.01) |
| C08K 9/06 | (2006.01) |
| H01L 23/427 | (2006.01) |
| C08K 3/22 | (2006.01) |
| C08K 3/18 | (2006.01) |
| C08K 3/28 | (2006.01) |

(52) U.S. Cl.
CPC ............... *C09K 5/063* (2013.01); *C08K 3/00* (2013.01); *C08K 3/0008* (2013.01); *C08K 9/06* (2013.01); *C08L 101/00* (2013.01); *C09K 5/00* (2013.01); *H01L 23/427* (2013.01); *H01L 23/4275* (2013.01); *C08K 3/18* (2013.01); *C08K 3/22* (2013.01); *C08K 3/28* (2013.01); *C08K 2003/222* (2013.01); *C08K 2003/2227* (2013.01); *C08K 2003/2296* (2013.01); *C08K 2201/001* (2013.01); *C08K 2201/005* (2013.01)

(58) Field of Classification Search
CPC .... C08K 2003/2296; C08K 2003/2227; C08K 2003/222; C08K 3/28; C08K 3/26; C08K 3/18; C08K 3/22
See application file for complete search history.

(56) References Cited

U.S. PATENT DOCUMENTS

| 5,213,704 A * | 5/1993 | Anderson, Jr. ......... C09K 5/08 252/73 |
| 2005/0205989 A1* | 9/2005 | Shibuya ................... C09K 5/14 257/712 |
| 2011/0009544 A1 | 1/2011 | Funahashi |
| 2015/0008361 A1 | 1/2015 | Hattori |

FOREIGN PATENT DOCUMENTS

| JP | 46-036451 B | 10/1971 |
| JP | 56-042098 | 4/1981 |
| JP | 2010-163510 | 7/2010 |
| JP | 2010-184981 | 8/2010 |
| JP | 2010-235709 | 10/2010 |
| JP | 2012-102264 | 5/2012 |
| WO | 2009/136542 | 11/2009 |
| WO | 2013/129600 | 9/2013 |
| WO | 2015/033690 | 3/2015 |

OTHER PUBLICATIONS

English language abstract CN 101899214 Dec. 1, 2010.*
English language translation CN101899214; Dec. 2010.*
Notification of Reasons for Rejection of corresponding JP application No. JP 2015-525674 with its full translation.

* cited by examiner

*Primary Examiner* — Margaret Moore
(74) *Attorney, Agent, or Firm* — Hamre, Schumann, Mueller & Larson, P.C.

(57) ABSTRACT

A heat storage composition (20) of the present invention includes a matrix resin (21) and heat storage inorganic particles (22). The heat storage inorganic particles (22) are composed of a material that undergoes an electronic phase transition and has a latent heat of 1 J/cc or more for the electronic phase transition. The amount of the heat storage inorganic particles is 10 to 2000 parts by weight with respect to 100 parts by weight of the matrix resin. The heat conductivity of the heat storage composition is 0.3 W/m·K or more. The heat storage composition may further include heat conductive particles (23, 24). The heat storage inorganic particles are preferably metal oxide particles containing vanadium as the main metal component. The heat storage composition has high heat storage properties and high heat conduction properties, and is used as a heat storage silicone material provided between a heat generating component and a case. Since heat from the heat generating component is temporarily stored in the heat storage composition so that the heat conduction is delayed, the heat is diffused during the delay to eliminate partial heating, thereby resulting in uniform heat dissipation.

12 Claims, 6 Drawing Sheets

HEAT-STORAGE COMPOSITION

TECHNICAL FIELD

The present invention relates to a heat storage composition. More specifically, the present invention relates to a heat storage composition having heat storage properties and heat conduction properties.

BACKGROUND ART

A semiconductor used in electronic equipment or the like generates heat during operation, and the performance of electronic components may be reduced by the heat. Therefore, a metallic heat dissipating member is generally attached to a heat generating electronic component via a heat conductive sheet in the form of gel or soft rubber. In recent years, however, another method has been proposed in which a heat storage material sheet is attached to a heat generating electronic component so that heat is stored in the heat storage material sheet, and thus a heat transfer rate is reduced.

Patent Documents 1 to 2 propose heat storage rubber that incorporates microcapsules containing a heat storage material. Patent Document 3 proposes a member for countermeasures against heat. The member is obtained by coating the entire surface of a silicone elastomer with a coating material. The silicon elastomer includes a paraffin wax polymer and a heat conductive filler. Patent Document 4 proposes, e.g., a vanadium oxide containing trace metal such as tungsten as a heat storage material.

PRIOR ART DOCUMENTS

Patent Documents

Patent Document 1: JP 2010-184981A
Patent Document 2: JP 2010-235709 A
Patent Document 3: JP 2012-102264 A
Patent Document 4: JP 2010-163510 A

DISCLOSURE OF INVENTION

Problem to be Solved by the Invention

However, the approaches in Patent Documents 1 to 2 have the problem that heat is not easily transferred from the heat generating member to the heat storage material, since the gel or soft rubber itself is a heat insulating material. The approaches in Patent Documents 3 to 4 also have the problem that both heat storage properties and heat conduction properties need to be improved further. Moreover, the microcapsules are likely to be broken when they are mixed with a matrix resin material. Patent Documents 1 to 3 utilize latent heat associated with a change in the state of the material (such as paraffin) from liquid to solid or solid to liquid. However, the material in the liquid state is dissolved in a matrix phase and cannot provide the heat storage effect, or the heat storage performance is reduced, upon repeated use. To deal with this issue, it has been proposed that a material having the heat storage effect is microencapsulated. However, some of the microcapsules are likely to be broken when they are mixed with a matrix material, and thus the microencapsulation is not sufficient to suppress a reduction in the heat storage performance due to the repeated use. In the member for countermeasures against heat of Patent Document 3, the entire surface of the silicone elastomer that includes the paraffin wax polymer and the heat conductive filler is coated with the coating material in order to prevent leaching of the paraffin wax (heat storage material). However, Patent Document 3 cannot solve the fundamental problem of a reduction in the heat storage performance due to the repeated use. Patent Document 4 teaches that an electronic phase transition rather than the latent heat of a liquid-solid phase change contributes to the heat storage effect. However, Patent Document 4 does not refer to the possibility or expected effect of using a material that undergoes an electronic phase transition in combination with a polymer matrix. Moreover, the use of the material that undergoes an electronic phase transition with a thermosetting polymer may inhibit the curing of the polymer.

To solve the above conventional problems, the present invention provides a physically stable heat storage composition having high heat storage properties and high heat conduction properties.

Means for Solving Problem

A heat storage composition of the present invention includes a matrix resin and heat storage inorganic particles. The heat storage inorganic particles are composed of a material that undergoes an electronic phase transition and has a latent heat of 1 J/cc or more for the electronic phase transition. The amount of the heat storage inorganic particles is 10 to 2000 parts by weight with respect to 100 parts by weight of the matrix resin. The heat conductivity of the heat storage composition is 0.3 W/m·K or more.

Effects of the Invention

The heat storage composition of the present invention includes 10 to 2000 parts by weight of heat storage inorganic particles with respect to 100 parts by weight of a matrix resin. The heat storage inorganic particles are composed of a material that undergoes an electronic phase transition and has a latent heat of 1 J/cc or more for the electronic phase transition. The heat conductivity of the heat storage composition is 0.3 W/m·K or more. With this configuration, the heat storage composition has high heat storage properties and high heat conduction properties. When the heat storage composition is provided between a heat generating component and a case, a higher heat storage effect can be obtained. Since heat from the heat generating component is temporarily stored in the heat storage composition so that the heat conduction is delayed, the heat is diffused during the delay to eliminate partial heating, thereby resulting in uniform heat dissipation. Moreover, mixing the heat storage inorganic particles with the matrix resin can produce a stable heat storage composition.

DESCRIPTION OF THE INVENTION

A heat storage composition of the present invention includes a matrix resin and heat storage inorganic particles. The heat storage inorganic particles are composed of a material that undergoes an electronic phase transition and has a latent heat of 1 J/cc or more for the electronic phase transition. The heat storage inorganic particles are preferably metal oxide particles containing vanadium as the main metal component. The amount of the heat storage inorganic particles is 10 to 2000 parts by weight with respect to 100 parts by weight of the matrix resin. The heat conductivity of the heat storage composition is 0.3 W/m·K or more. The metal oxide particles containing vanadium as the main metal component have both good heat storage properties and good heat conductivity. Therefore, even if the matrix resin has thermal insulation properties, heat from the outside can be absorbed and stored in the heat storage composition. Moreover, the above heat conductivity can facilitate the absorption of heat from the outside into the heat storage composition.

Figure 7:
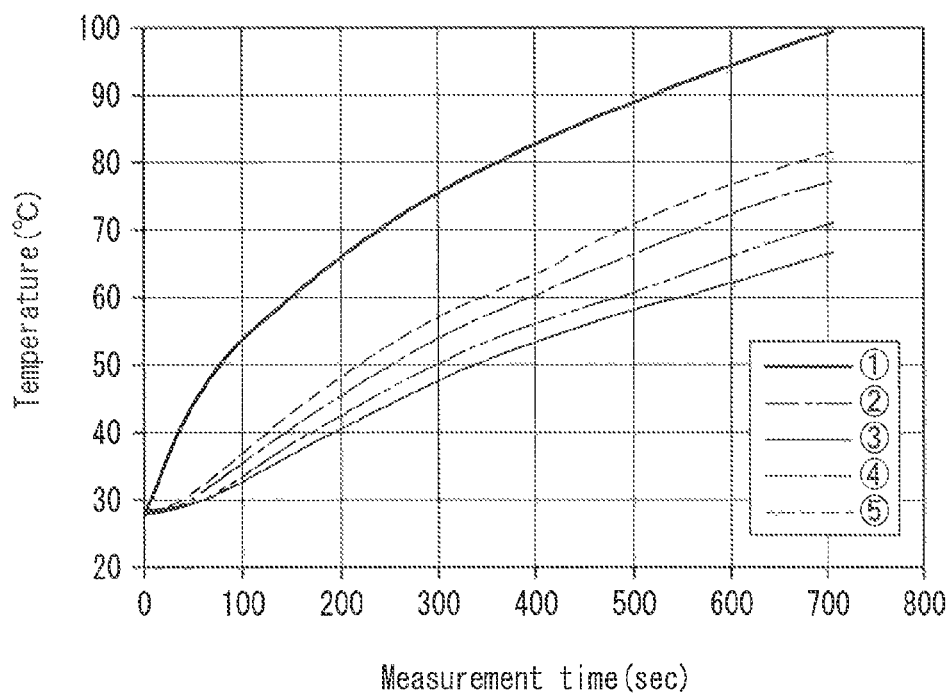
FIG. 7 is a graph showing an increase in the temperature of a sheet in Comparative Example 2.

Preferred examples of the heat storage inorganic particles composed of a material that undergoes an electronic phase transition and has a latent heat of 1 J/cc or more for the electronic phase transition include the following: $VO_2$, $LiMn_2O_4$, $LiVS_2$, $LiVO_2$, $NaNiO_2$, $LiRh_2O_4$, $V_2O_3$, $V_4O_7$, $V_6O_{11}$, $Ti_4O_7$, $SmBaFe_2O_5$, $EuBaFe_2O_5$, $GdBaFe_2O_5$, $TbBaFe_2O_5$, $DyBaFe_2O_5$, $HoBaFe_2O_5$, $YBaFe_2O_5$, $PrBaCo_2O_{5.5}$, $DyBaCo_2O_{5.54}$, $HoBaCo_2O_{5.48}$, and $YBaCo_2O_{5.49}$. FIG. 7 of Patent Document 4 shows the electronic phase transition temperature and the latent heat for the electronic phase transition of the above compounds. In particular, $VO_2$ is preferred in terms of the heat storage properties and the heat conductivity. The element Q such as Al, Ti, Cr, Mn, Fe, Cu, Ga, Ge, Zr, Nb, Mo, Ru, Sn, Hf, Ta, W, Re, Os, or Ir may be dissolved in the vanadium oxide to form a solid solution. It is preferable that $VO_2$ containing the element Q is expressed by $V_{(1-x)}Q_xO_2$ (where $0 \leq x<1$).

The average particle size of vanadium oxide particles is preferably 0.1 to 100 μm, and more preferably 1 to 50 μm. This can improve the processability and the mixing performance with the matrix resin. The particle size may be measured with a laser diffraction scattering method to determine a particle size at 50% (by mass). The method may use a laser diffraction particle size analyzer LA-950S2 manufactured by Horiba, Ltd.

The heat storage inorganic particles of the present invention can be either used as they are or surface treated with alkoxysilane or alkyl titanate. In the surface treatment, alkoxysilane or alkyl titanate is brought into contact with the surface of the heat storage inorganic particles and held by adsorption or a chemical bond, which makes the particles chemically stable. The alkoxysilane is preferably a silane compound or its partial hydrolysate. The silane compound is expressed by $R(CH_3)_a Si(OR')_{3-a}$, where R represents an alkyl group having 1 to 20 carbon atoms, R' represents an alkyl group having 1 to 4 carbon atoms, and a is 0 or 1. Specifically, the alkoxysilane is the same as a surface treatment agent for heat conductive inorganic particles, as will be described later. The treatment conditions are also the same. The alkyl titanate is preferably tetrabutyl titanate. When the surface-treated heat storage inorganic particles are used with a thermosetting polymer, the curing of the polymer is not inhibited, so that a stable heat storage composition can be obtained. If the heat storage inorganic particles are not surface treated, the curing of the polymer may be inhibited. Thus, the previous surface treatment of the heat storage inorganic particles can prevent the curing of the polymer from being inhibited.

The matrix resin may be either a thermosetting resin or a thermoplastic resin. The matrix resin may also include rubber and an elastomer. Examples of the thermosetting resin include (but are not limited to) the following: epoxy resin; phenol resin; unsaturated polyester resin; and melamine resin. Examples of the thermoplastic resin include (but are not limited to) the following: polyolefin such as polyethylene or polypropylene; polyester; nylon; ABS resin; methacrylate resin; polyphenylene sulfide; fluorocarbon resin; polysulfone; polyetherimide; polyethersulfone; polyetherketone; liquid crystalline polyester; polyimide; and copolymers, polymer alloys, or blended materials of them. A mixture of two or more types of thermoplastic resins may also be used. Examples of the rubber include (but are not limited to) the following: natural rubber (NR: ASTM abbreviation); isoprene rubber (IR); butadiene rubber (BR); 1,2-polybutadiene rubber (1,2-BR); styrene-butadiene rubber (SBR); chloroprene rubber (CR); nitrile rubber (NBR); butyl rubber (IIR); ethylene-propylene rubber (EPM, EPDM); chlorosulfonated polyethylene (CSM); acrylic rubber (ACM, ANM); epichlorohydrin rubber (CO, ECO); polysulfide rubber (T); silicone rubber; fluorocarbon rubber (FKM); and urethane rubber (U). These materials can also be applied to the thermoplastic elastomer (TPE). Examples of the thermoplastic elastomer (TPE) include (but are not limited to) the following: styrene based TPE; olefin based TPE; vinyl chloride based TPE; urethane based TPE; ester based TPE; amide based TPE; chlorinated polyethylene based TPE; syn-1,2-polybutadiene based TPE; trans-1,4-polyisoprene based TPE; and fluorine based TPE.

The matrix resin is preferably an organopolysiloxane. This is because the organopolysiloxane has high heat resistance and good processability. The heat storage composition including the organopolysiloxane as a matrix may be in any form of rubber, rubber sheet, putty, or grease.

When the organopolysiloxane is used as a matrix resin, a compound with the following composition may be obtained by crosslinking.

(A) Base polymer component: a linear organopolysiloxane having an average of two or more alkenyl groups per molecule, in which the alkenyl groups are bonded to silicon atoms at both ends of the molecular chain.

(B) Crosslinking component: an organohydrogenpolysiloxane having an average of two or more hydrogen atoms bonded to silicon atoms per molecule, in which the amount of the organohydrogenpolysiloxane is less than 1 mol with respect to 1 mol of the alkenyl groups bonded to the silicon atoms in the component (A).

(C) Platinum-based metal catalyst: the amount of the catalyst is 0.01 to 1000 ppm in weight with respect to the component (A).

(D) Heat storage inorganic particles (metal oxide particles containing vanadium as the main metal component): the amount of the heat storage inorganic particles is 10 to 2000 parts by weight with respect to 100 parts by weight of the matrix resin.

(E) Heat conductive particles (if added): the amount of the heat conductive particles is 100 to 2000 parts by weight with respect to 100 parts by weight of the matrix resin.

(F) Inorganic pigment: the amount of the inorganic pigment is 0.1 to 10 parts by weight with respect to 100 parts by weight of the matrix resin.

(1) Base Polymer Component

The base polymer component (component (A)) is an organopolysiloxane having two or more alkenyl groups bonded to silicon atoms per molecule. The organopolysiloxane containing two alkenyl groups is the base resin (base polymer component) of the silicone rubber composition of the present invention. In the organopolysiloxane, two alkenyl groups having 2 to 8 carbon atoms, and preferably 2 to 6 carbon atoms such as vinyl groups or allyl groups are bonded to the silicon atoms per molecule. The viscosity of the organopolysiloxane is preferably 10 to 1000000 mPa·s, and more preferably 100 to 100000 mPa·s at 25° C. in terms of workability and curability.

Specifically, an organopolysiloxane expressed by the following general formula (chemical formula 1) is used. The organopolysiloxane has an average of two or more alkenyl groups per molecule, in which the alkenyl groups are bonded to silicon atoms at both ends of the molecular chain. The organopolysiloxane is a linear organopolysiloxane whose side chains are blocked with triorganosiloxy groups. The viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain.

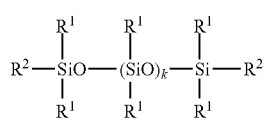

[Chemical Formula 1]

In this formula, $R^1$ represents substituted or unsubstituted monovalent hydrocarbon groups that are the same as or different from each other and have no aliphatic unsaturated bond, $R^2$ represents alkenyl groups, and k represents 0 or a positive integer. The monovalent hydrocarbon groups represented by $R^1$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups. The alkenyl groups represented by $R^2$ preferably have 2 to 6 carbon atoms, and more preferably 2 to 3 carbon atoms. Specific examples of the alkenyl groups include vinyl, allyl, propenyl, isopropenyl, butenyl, isobutenyl, hexenyl, and cyclohexenyl groups. In particular, the vinyl group is preferred. In the general formula (1), k is typically 0 or a positive integer satisfying $0 \leq k \leq 10000$, preferably $5 \leq k \leq 2000$, and more preferably $10 \leq k \leq 1200$.

The component (A) may also include an organopolysiloxane having three or more, typically 3 to 30, and preferably about 3 to 20, alkenyl groups bonded to silicon atoms per molecule. The alkenyl groups have 2 to 8 carbon atoms, and preferably 2 to 6 carbon atoms and can be, e.g., vinyl groups or allyl groups. The molecular structure may be a linear, ring, branched, or three-dimensional network structure. The organopolysiloxane is preferably a linear organopolysiloxane in which the main chain is composed of repeating diorganosiloxane units, and both ends of the molecular chain are blocked with triorganosiloxy groups. The viscosity of the linear organopolysiloxane is preferably 10 to 1000000 mPa·s, and more preferably 100 to 100000 mPa·s at 25° C.

Each of the alkenyl groups may be bonded to any part of the molecule. For example, the alkenyl group may be bonded to either a silicon atom that is at the end of the molecular chain or a silicon atom that is not at the end (but in the middle) of the molecular chain. In particular, a linear organopolysiloxane expressed by the following general formula (chemical formula 2) is preferred. The linear organopolysiloxane has 1 to 3 alkenyl groups on each of the silicon atoms at both ends of the molecular chain.

In this case, however, if the total number of the alkenyl groups bonded to the silicon atoms at both ends of the molecular chain is less than 3, at least one alkenyl group is bonded to the silicon atom that is not at the end of (but in the middle of) the molecular chain (e.g., as a substituent in the diorganosiloxane unit). As described above, the viscosity of the linear organopolysiloxane is preferably 10 to 1000000 mPa·s at 25° C. in terms of workability and curability. Moreover, the linear organopolysiloxane may include a small amount of branched structure (trifunctional siloxane units) in the molecular chain.

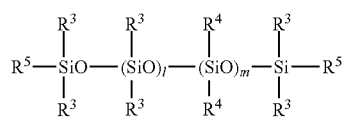

[Chemical Formula 2]

In this formula, $R^3$ represents substituted or unsubstituted monovalent hydrocarbon groups that are the same as or different from each other, and at least one of them is an alkenyl group, $R^4$ represents substituted or unsubstituted monovalent hydrocarbon groups that are the same as or different from each other and have no aliphatic unsaturated bond, $R^5$ represents alkenyl groups, and l and m represent 0 or a positive integer. The monovalent hydrocarbon groups represented by $R^3$ preferably have 1 to 10 carbon atoms, and more preferably 1 to 6 carbon atoms. Specific examples of the monovalent hydrocarbon groups include the following: alkyl groups such as methyl, ethyl, propyl, isopropyl, butyl, isobutyl, tert-butyl, pentyl, neopentyl, hexyl, cyclohexyl, octyl, nonyl, and decyl groups; aryl groups such as phenyl, tolyl, xylyl, and naphthyl groups; aralkyl groups such as benzyl, phenylethyl, and phenylpropyl groups; alkenyl groups such as vinyl, allyl, propenyl, isopropenyl, butenyl, hexenyl, cyclohexenyl, and octenyl groups; and substituted forms of these groups in which some or all hydrogen atoms are substituted by halogen atoms (fluorine, bromine, chlorine, etc.) or cyano groups, including halogen-substituted alkyl groups such as chloromethyl, chloropropyl, bromoethyl, and trifluoropropyl groups and cyanoethyl groups.

The monovalent hydrocarbon groups represented by $R^4$ also preferably have 1 to 10 carbon atoms, and more preferably 1 to 6 carbon atoms. The monovalent hydrocarbon groups may be the same as the specific examples of R', but do not include an alkenyl group. The alkenyl groups represented by $R^5$ preferably have 2 to 6 carbon atoms, and more preferably 2 to 3 carbon atoms. Specific examples of the alkenyl groups are the same as those of $R^2$ in the above formula (chemical formula 1), and the vinyl group is preferred.

In the general formula (chemical formula 2), l and m are typically 0 or positive integers satisfying $0<l+m\le10000$, preferably $5\le l+m\le2000$, and more preferably $10\le l+m\le1200$. Moreover, l and m are integers satisfying $0<l/(l+m)\le0.2$, and preferably $0.0011\le l/(l+m)\le0.1$.

(2) Crosslinking Component (Component (B))

The component (B) is an organohydrogenpolysiloxane that acts as a crosslinking agent. The addition reaction (hydrosilylation) between SiH groups in the component (B) and alkenyl groups in the component (A) produces a cured product. Any organohydrogenpolysiloxane that has two or more hydrogen atoms (i.e., SiH groups) bonded to silicon atoms per molecule may be used. The molecular structure of the organohydrogenpolysiloxane may be a linear, ring, branched, or three-dimensional network structure. The number of silicon atoms in a molecule (i.e., the degree of polymerization) may be 2 to 1000, and preferably about 2 to 300.

The locations of the silicon atoms to which the hydrogen atoms are bonded are not particularly limited. The silicon atoms may be either at the ends or not at the ends (but in the middle) of the molecular chain. The organic groups bonded to the silicon atoms other than the hydrogen atoms may be, e.g., substituted or unsubstituted monovalent hydrocarbon groups that have no aliphatic unsaturated bond, which are the same as those of R1 in the above general formula (chemical formula 1).

The following structures can be given as examples of the organohydrogenpolysiloxane of the component (B).

[Chemical Formula 3]

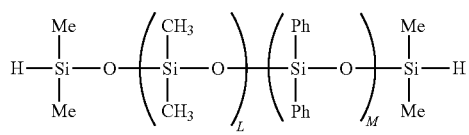

[Chemical Formula 4]

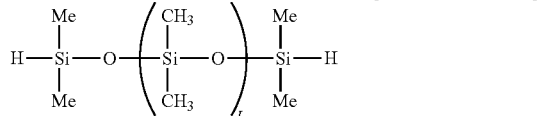

[Chemical Formula 5]

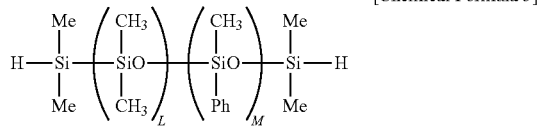

In these formulas, Ph represents organic groups including at least one of phenyl, epoxy, acryloyl, methacryloyl, and alkoxy groups, L is an integer of 0 to 1000, and preferably 0 to 300, and M is an integer of 1 to 200.

(3) Catalyst Component

The component (C) is a catalyst component that accelerates the curing of the composition of the present invention. The component (C) may be a known catalyst used for a hydrosilylation reaction. Examples of the catalyst include platinum group metal catalysts such as platinum-based, palladium-based, and rhodium-based catalysts. The platinum-based catalysts include, e.g., platinum black, platinum chloride, chloroplatinic acid, a reaction product of chloroplatinic acid and monohydric alcohol, a complex of chloroplatinic acid and olefin or vinylsiloxane, and platinum bisacetoacetate. The component (C) may be mixed in an amount that is required for curing, and the amount can be appropriately adjusted in accordance with the desired curing rate or the like. The component (C) is added at 0.01 to 1000 ppm based on the weight of metal atoms to the component (A).

(4) Heat Storage Inorganic Particles

As described above, the heat storage inorganic particles of the component (D) are composed of a material that undergoes an electronic phase transition and has a latent heat of 1 J/cc or more for the electronic phase transition. The heat storage inorganic particles are preferably metal oxide particles containing vanadium as the main metal component. The heat storage inorganic particles may be surface treated with a silane compound, a partial hydrolysate of the silane compound, or alkyl titanate. The silane compound is expressed by $R(CH_3)_aSi(OR')_{3-a}$, where R represents an alkyl group having 1 to 20 carbon atoms, R' represents an alkyl group having 1 to 4 carbon atoms, and a is 0 or 1. If the heat storage inorganic particles are not surface treated, the curing of the polymer may be inhibited. Thus, the previous surface treatment of the heat storage inorganic particles can prevent the curing of the polymer from being inhibited.

(5) Heat Conductive Particles

If the heat conductive particles of the component (E) are added, the amount of the heat conductive particles is 100 to 2000 parts by weight with respect to 100 parts by weight of the matrix component. The addition of the heat conductive particles can further improve the heat conductivity of the heat storage composition. The heat conductive particles are preferably composed of at least one selected from alumina, zinc oxide, magnesium oxide, aluminum nitride, boron nitride, aluminum hydroxide, and silica. The heat conductive particles may have various shapes such as spherical, scaly, and polyhedral. When alumina is used, a-alumina with a purity of 99.5 wt % or more is preferred. The specific surface area of the heat conductive particles is preferably 0.06 to 10 m$^2$/g. The specific surface area is a BET specific surface area, and is measured in accordance with JIS R1626. The average particle size of the heat conductive particles is preferably 0.1 to 100 μm. The particle size may be measured with a laser diffraction scattering method to determine a particle size at 50% (by mass). The method may use a laser diffraction particle size analyzer LA-950S2 manufactured by Horiba, Ltd.

The heat conductive particles preferably include at least two types of inorganic particles with different average particle sizes. This is because small-size inorganic particles fill the spaces between large-size inorganic particles, which can provide nearly the closest packing and improve the heat conductivity.

It is preferable that the inorganic particles are surface treated with a silane compound or its partial hydrolysate. The silane compound is expressed by $R(CH_3)_aSi(OR')_{3-a}$, where R represents an alkyl group having 1 to 20 carbon atoms, R' represents an alkyl group having 1 to 4 carbon atoms, and a is 0 or 1. Examples of an alkoxysilane compound (simply referred to as "silane" in the following) expressed by $R(CH_3)_aSi(OR')_{3-a}$, where R represents an alkyl group having 1 to 20 carbon atoms, R' represents an alkyl group having 1 to 4 carbon atoms, and a is 0 or 1, include the following: methyltrimethoxysilane; ethyltrimethoxysilane; propyltrimethoxysilane; butyltrimethoxysilane; pentyltrimethoxysilane; hexyltrimethoxysilane; hexyltriethoxysilane; octyltrimethoxysilane; octyltriethoxysilane; decyltrimethoxysilane; decyltriethoxysilane; dodecyltrimethoxysilane; dodecyltriethoxysilane; hexadodecyltrimethoxysilane; hexadodecyltriethoxysilane; octadecyltrimethoxysilane; and octadecyltriethoxysilane. These silane compounds may be used individually or in combinations of two or more. The alkoxysilane and one-end silanol siloxane may be used together as the surface treatment agent. In this case, the surface treatment may include adsorption in addition to a covalent bond. It is preferable that the particles with an average particle size of 2 μm or more are added in an amount of 50 wt % or more when the total amount of particles is 100 wt %.

(6) Other Components

The composition of the present invention may include components other than the above as needed. For example, the composition may include an inorganic pigment such as colcothar, and alkyltrialkoxysilane used, e.g., for the surface treatment of a filler.

The heat conductivity of a heat conductive silicone material of the present invention is 0.3 W/m·K or more, preferably 0.3 to 10 W/m·K, and more preferably 1 to 10 W/m·K. By controlling the heat conductivity within these ranges, heat can be efficiently transferred from the heat generating member to the heat storage material. The measurement method of the heat storage properties will be described in Examples.

Figure 1:
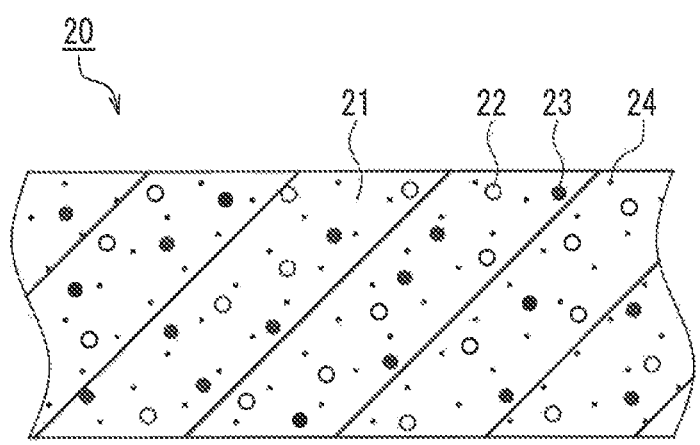
FIG. 1 is a schematic cross-sectional view of a heat storage composition sheet in an example of the present invention.

FIG. 1 is a schematic cross-sectional view of a heat storage silicone rubber sheet 20 of an example. The silicone rubber sheet 20 includes heat storage inorganic particles 22, heat conductive large particles 23, and heat conductive small particles 24 in a crosslinked organopolysiloxane 21. When the heat storage silicone material having high heat storage properties and high heat conduction properties is provided between a heat generating component and a case, a higher heat storage effect can be obtained.

EXAMPLES

Hereinafter, the present invention will be described by way of examples. However, the present invention is not limited to the following examples.

<Heat Storage Evaluation Test>

Figure 3:
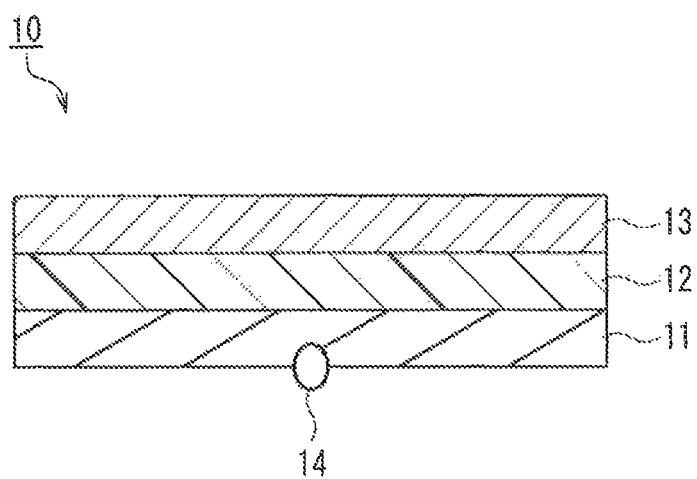
FIG. 3 is a diagram illustrating a method for measuring a heat storage evaluation test of a heat storage composition sheet in an example of the present invention.

FIG. 3 shows a heat storage evaluation test apparatus 10. A heat storage composition sheet 12 is placed on a ceramic heater 11, and an aluminum plate 13 is placed on the heat storage composition sheet 12. A thermocouple 14 is attached to the underside of the ceramic heater 11. A heat storage evaluation test was performed by measuring the time it takes for heat from the ceramic heater 11 to reach the thermocouple 14. Specifically, the evaluation test was performed by measuring the time it takes for the temperature of the thermocouple 14 to rise from 30° C. to 85° C. Each of the components is described in detail below.

(1) Ceramic heater 11 (25 mm long, 25 mm wide, and 1.75 mm thick) with applied power of 5 W.

(2) Heat storage composition sheet 12 (25 mm long, 25 mm wide, and 2 mm thick), in which a light coating of grease was applied to both sides of the sheet.

(3) Aluminum plate 13 (22.5 mm long, 22.5 mm wide, and 4 mm thick).

<Method for Measuring Heat Resistance Value and Heat Conductivity>

Figure 2A:
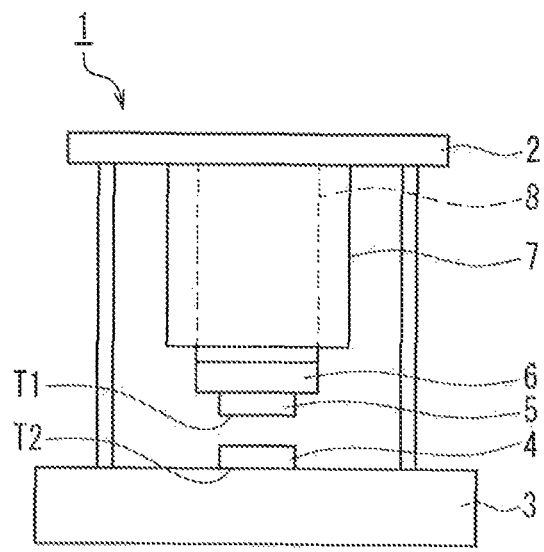
FIGS. 2A and 2B are diagrams illustrating a method for measuring a heat conductivity and a heat resistance value of a heat storage composition sheet in an example of the present invention.
Figure 2B:
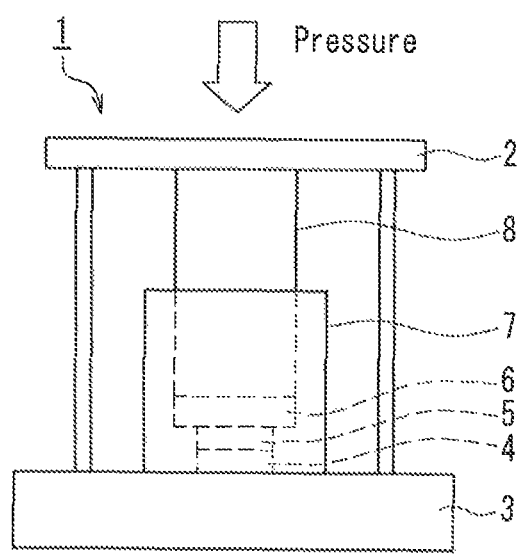

The measurement was performed using a TIM-Tester (manufactured by Analysis Tech Inc.) in accordance with ASTM D5470. FIGS. 2A to 2B show schematic views of a heat resistance measuring apparatus 1. As shown in FIG. 2A, a sheet sample 4 with a diameter of 33 mm is placed on a cooling plate 3. A heater 5, a load cell 6, and a cylinder 8 are incorporated in this order into the upper portion of the apparatus 1. A cylindrical heat insulator 7 is set outside of the cylinder 8 so as to move down. Reference numeral 2 represents a top. FIG. 2B shows the state of the apparatus 1 during the measurement. The cylinder 8 was driven to increase the pressure to 100 kPa. Based on (a) a temperature difference between the temperature T1 of the heater 5 and the temperature T2 of the cooling plate 3 and (b) a heat flow rate, a heat resistance value Rt was calculated by the following formula. The heat resistance value Rt and the thickness of the sample were used to calculate a heat conductivity.

$$Rt=[(T1-T2)/Q]\times S$$

Rt: Heat resistance value (° C.·cm$^2$/W)
T1: Temperature of heater (° C.)
T2: Temperature of cooling plate (° C.)
Q: Heat flow rate (W)
S: Sample contact area (cm$^2$)

<Specific Gravity>

The specific gravity was measured in accordance with JIS K 6220.

<Hardness>

The hardness was measured using a 3 mm thick sheet according to IRHD Supersoft. The measurement time was 10 seconds.

Example 1

1. Material Component (1) Silicone Component

Two-part, room temperature curing (two-part RTV) silicone rubber was used as a silicone component. A base polymer component (component (A)), a crosslinking component (component (B)), and a platinum-based metal catalyst (component (C)) had previously been added to the two-part RTV silicone rubber. The term "two-part RTV" means two-part room temperature vulcanizing.

(2) Heat Storage Inorganic Particles

The particles of vanadium dioxide ($VO_2$) with an average particle size of 20 μm were added in an amount of 400 parts by weight (46 vol %) per 100 parts by weight of the silicone component, and uniformly mixed. The latent heat of the vanadium dioxide ($VO_2$) particles produced during the electronic phase transition was 245 J/cc.

2. Sheet Forming and Processing Method

A 3 mm thick metal frame was placed on a polyester film that had been subjected to a release treatment. Subsequently, a compound was poured into the metal frame, on which another polyester film that had been subjected to a release treatment was disposed. This layered product was cured at a pressure of 5 MPa and a temperature of 120° C. for 10 minutes, thereby forming a silicone rubber sheet with a thickness of 3.0 mm.

Table 1 shows the physical properties of the silicone rubber sheet thus formed.

Example 2

1. Material Component (1) Silicone Component

Two-part, room temperature curing (two-part RTV) silicone rubber was used as a silicone component. A base polymer component (component (A)), a crosslinking component (component (B)), and a platinum-based metal catalyst (component (C)) had previously been added to the two-part RTV silicone rubber.

(2) Heat Storage Inorganic Particles

The particles of vanadium dioxide ($VO_2$) with an average particle size of 20 μm were added in an amount of 200 parts by weight (9 vol %) per 100 parts by weight of the silicone component, and uniformly mixed.

(3) Heat Conductive Particles (a) Small-size Heat Conductive Particles

The small-size heat conductive particles were composed of alumina with an average particle size of 1 μm and were surface treated with a silane coupling agent. The amount of the small-size heat conductive particles added was 100 parts by weight per 100 parts by weight of the silicone component.

(b) Middle-size Heat Conductive Particles

The middle-size heat conductive particles were composed of alumina with an average particle size of 3 μm and were surface treated with a silane coupling agent.

The amount of the middle-size heat conductive particles added was 300 parts by weight per 100 parts by weight of the silicone component.

(c) Large-size Heat Conductive Particles

The large-size heat conductive particles included two types of particles as follows, both of which were not surface treated with a silane coupling agent and were used as they were.

(i) The particles of alumina with an average particle size of 50 μm were used. The amount of the particles added was 600 parts by weight per 100 parts by weight of the silicone component.

(ii) The particles of aluminum nitride with an average particle size of 50 μm were used. The amount of the particles added was 300 parts by weight per 100 parts by weight of the silicone component.

(d) Amount of Heat Conductive Particles Added

A total of 1300 parts by weight of the heat conductive particles, i.e., 100 parts by weight of the small-size heat conductive particles, 300 parts by weight of the middle-size heat conductive particles, and 900 parts by weight of the large-size heat conductive particles were added to 100 parts by weight of the silicone component.

2. Sheet Forming and Processing Method

A silicone rubber sheet was formed in the same manner as Example 1.

Table 1 shows the physical properties of the silicone rubber sheet thus formed.

Comparative Example 1

1. Material Component (1) Silicone Component

The same component as that in Example 1 was used.

(2) Heat Storage Particles

The heat storage particles were composed of a microencapsulated material ("Thermo Memory" (trade name), "FP-58" (product number) manufactured by Mitsubishi Paper Mills Limited, average particle size: 50 μm, melting point: 58° C., heat of solution: 54.9 J/g, bulk density: 0.3 to 0.4 g/cm$^3$). The heat storage particles were added in an amount of 30 parts by weight per 100 parts by weight of the silicone component.

2. Sheet Forming and Processing Method

A silicone rubber sheet was formed in the same manner as Example 1.

Table 1 shows the physical properties of the silicone rubber sheet thus formed.

TABLE 1

|  | Ex. 1 | Ex. 2 | Comp. Ex. 1 |
|---|---|---|---|
| Silicone component (parts by weight) | 100 | 100 | 100 |
| Heat storage particles (parts by weight) | $VO_2$: 400 | $VO_2$: 200 | heat storage capsule: 30 |
| Heat conductive particles (parts by weight) | 0 | 1300 | 0 |
| Heat storage properties (time required for temperature rise from 30° C. to 85° C.: sec) | 638 | 757 | 392 |
| Heat conductivity (W/m · K) | 0.9 | 5.0 | 0.2 |
| Heat resistance value   100 kPa (° C. · cm$^2$/W) | 20.9 | 5.0 | 184.8 |
| 300 kPa (° C. · cm$^2$/W) | 10.3 | 3.2 | 172.6 |
| 500 kPa (° C. · cm$^2$/W) | 7.2 | 2.3 | 151.5 |
| Specific gravity | 2.65 | 3.24 | 0.96 |
| Hardness | 67.8 | 70.9 | 91.3 |

Figure 4:
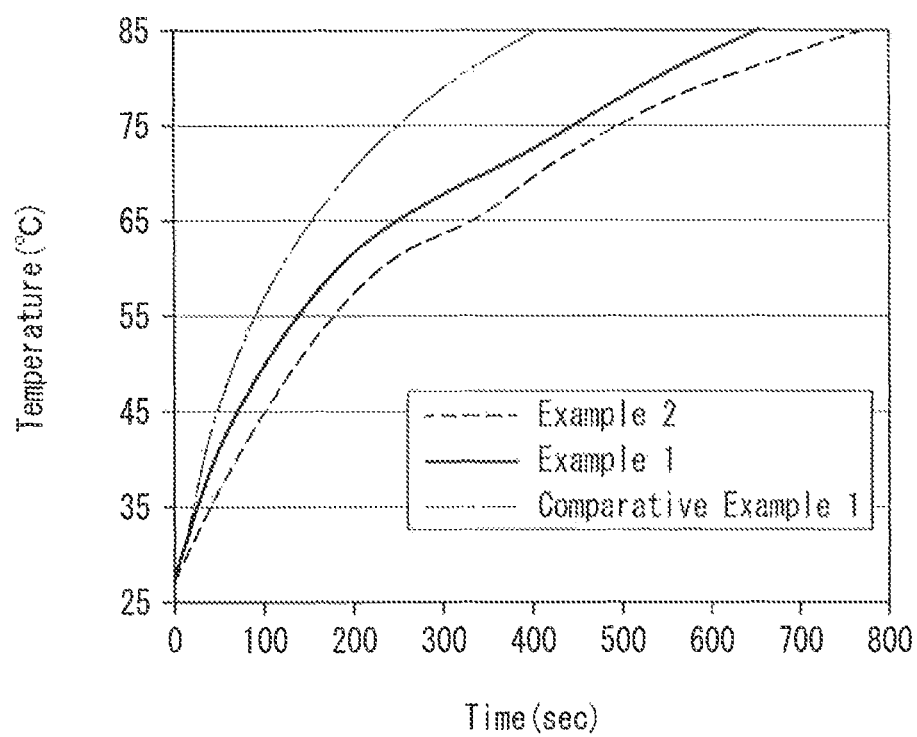
FIG. 4 is a graph showing increases in the temperature of sheets in Examples 1 and 2 of the present invention and Comparative Example 1.

FIG. 4 is a graph showing the results of the heat storage evaluation test. As can be seen from FIG. 4, the silicon rubber sheet in Example 2, which had a high heat conductivity, started to store heat at the lowest temperature. Moreover, the heat storage effect (i.e., the amount of heat stored) increased with an increase in the heat conductivity. Thus, it is evident that the higher the heat conduction properties are, the better the heat storage properties are. The results confirmed that the silicon rubber sheets in Examples 1, 2 of the present invention had both a high heat conductivity (see Table 1) and high heat storage properties.

Example 3 and Comparative Examples 2 to 3

Table 2 shows each composition. The surface treatment of the heat conductive particles in Example 3 was the same as that in Example 2. A total of 1625 parts by weight of the heat conductive particles, i.e., 200 parts by weight of the small-size heat conductive particles, 425 parts by weight of the middle-size heat conductive particles, and 1000 parts by weight of the large-size heat conductive particles were added to 100 parts by weight of the silicone component. Other than the above, the experiments were performed in the same manner as Example 2.

Comparative Example 2 used the same microencapsulated heat storage particles as those in Comparative Example 1. Comparative Example 3 used the heat conductive particles alone.

Figure 5A:
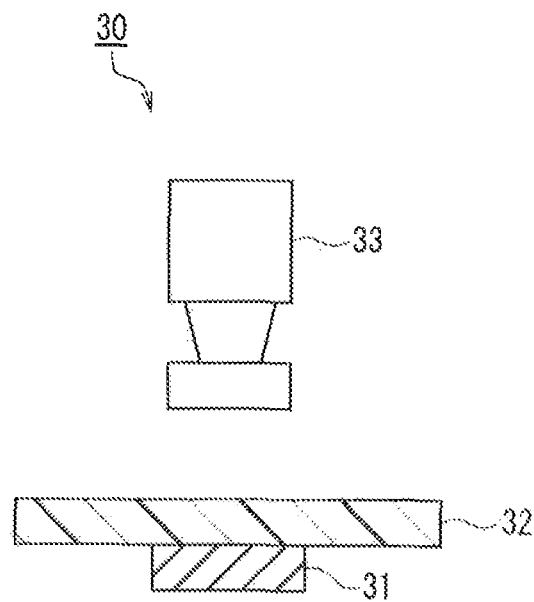
FIG. 5A is a schematic cross-sectional view of a heat diffusion measuring apparatus in an example of the present invention.
Figure 5B:
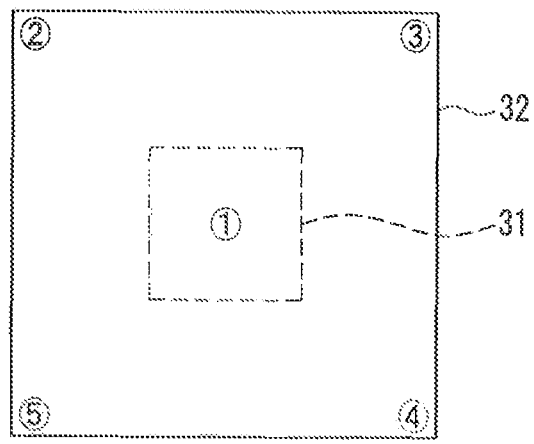
FIG. 5B is a plan view showing the measurement points of the temperature of a heat storage silicone rubber sheet in an example of the present invention.

The heat diffusion properties of the silicone rubber sheets thus formed were measured. FIG. 5A shows a heat diffusion measuring apparatus 30. A silicone rubber sheet 32 was placed on a ceramic heater 31, and the temperature was measured by a thermograph 33 that was located 150 mm above the silicone rubber sheet 32. The surface of the ceramic heater 31 was coated with grease, and the silicone rubber sheet 32 was attached to this surface so that contact heat resistance was reduced. The ceramic heater 31 was 10 mm long and 10 mm wide, and was rated at 100 V, 100 W. The applied power was 5 W. The silicone rubber sheet 32 was 25 mm long, 25 mm wide, and 3.0 mm thick. FIG. 5B shows the measurement points of the silicone rubber sheet 32: the circled number 1 represents a central portion and the circled numbers 2 to 5 represent four corners. The measurement was performed in an atmosphere at room temperature of 25° C. Table 2 shows the conditions and the results together.

TABLE 2

| | | Ex. 3 | Comp. Ex. 2 | Comp. Ex. 3 |
|---|---|---|---|---|
| Silicone polymer (parts by weight) | | 100 | 100 | 100 |
| Heat conductive particles (parts by weight) | | 1625 | 1625 | 1625 |
| Vanadium dioxide (parts by weight) | | 200 | — | — |
| Heat storage capsule (parts by weight) | | — | 45 | — |
| Platinum catalyst (parts by weight) | | 1 | 1 | 1 |
| Crosslinking agent (parts by weight) | | 0.25 | 0.25 | 0.25 |
| Volume fraction of heat storage material *1 (vol %) | | 7 | 7 | 0 |
| Heat storage properties (time required for temperature rise from 30° C. to 85° C.: sec) | | 811 | 734 | 723 |
| Heat conductivity (W/m · K) | | 9.6 | 9.0 | 9.0 |
| Heat resistance value | 100 kPa (° C. · cm²/W) | 3.0 | 3.2 | 3.1 |
| | 300 kPa (° C. · cm²/W) | 2.7 | 2.9 | 2.8 |
| | 500 kPa (° C. · cm²/W) | 2.4 | 2.7 | 2.5 |
| Specific gravity | | 3.3 | 3.2 | 3.2 |
| Hardness | | 94.1 | 95.2 | 93.8 |
| Heat diffusion properties | Temperature (° C.) of central portion of sheet when 700 seconds passed | 93 | 99 | 98 |
| | Average temperature (° C.) of four corners of sheet when 700 seconds passed | 68 | 75 | 74 |

Note
*1 The volume fraction of the heat storage material was calculated from density.

Figure 6:
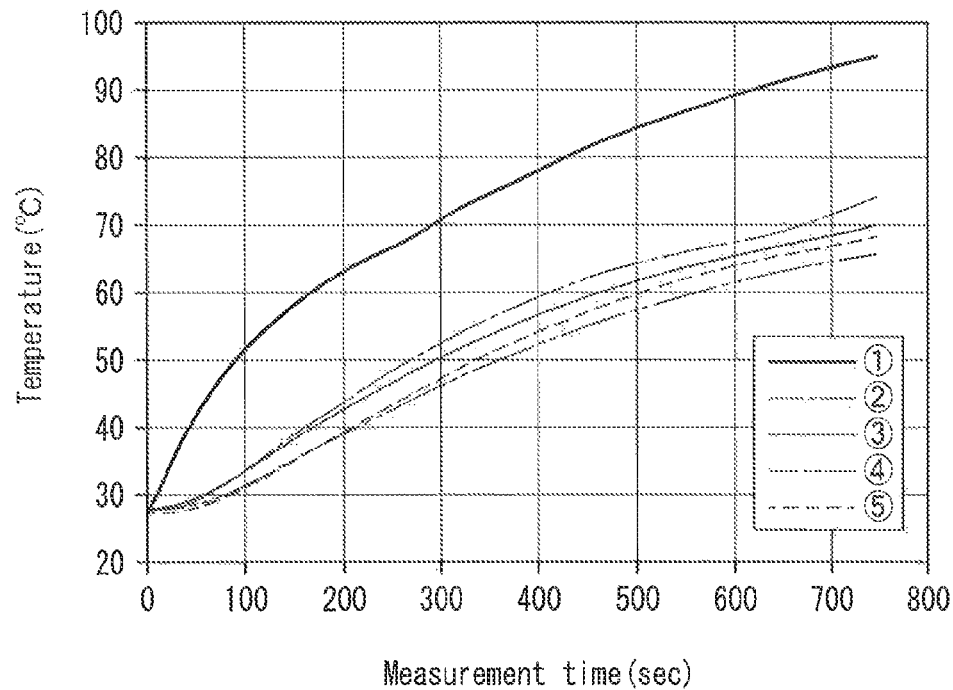
FIG. 6 is a graph showing an increase in the temperature of a sheet in Example 3 of the present invention.
Figure 8:
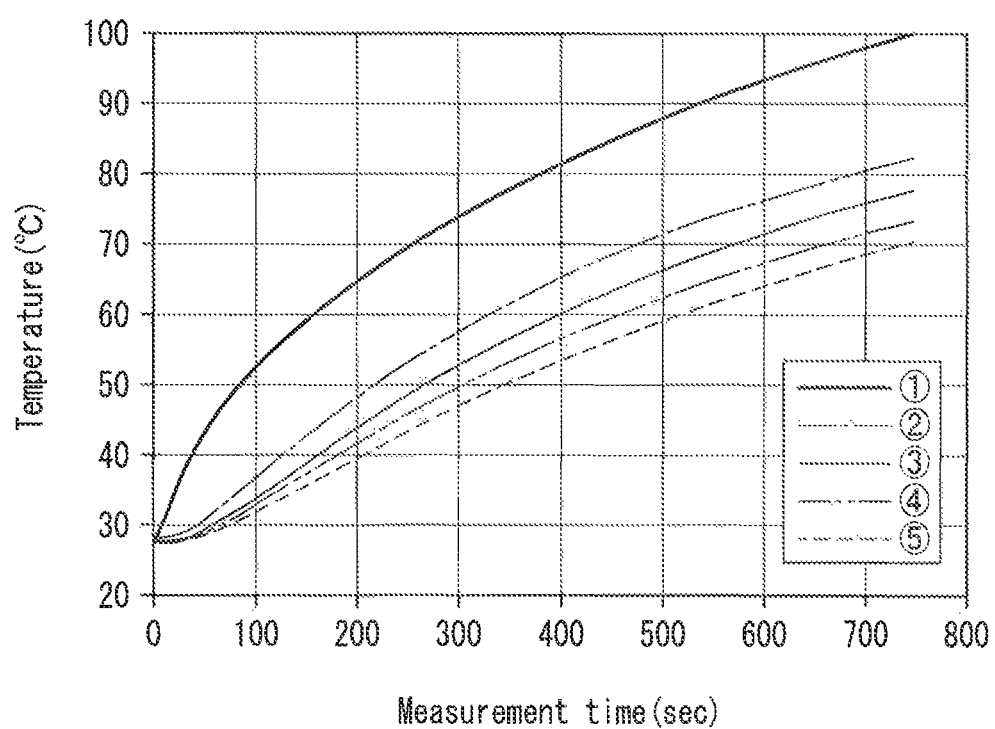
FIG. 8 is a graph showing an increase in the temperature of a sheet in Comparative Example 3.

FIG. 6 is a graph showing an increase in the temperature of the sheet in Example 3 of the present invention. FIG. 7 is a graph showing an increase in the temperature of the sheet in Comparative Example 2. FIG. 8 is a graph showing an increase in the temperature of the sheet in Comparative Example 3. The circled numbers 1 to 5 in FIGS. 6 to 8 correspond to the positions represented by the circled numbers 1 to 5 in FIG. 5B. As can be seen from Table 2 and FIGS. 6 to 8, the temperature of the central portion of the silicone rubber sheet in Example 3 was 93° C. when 700 seconds had passed. Therefore, the heat storage effect was more prominent in Example 3 than in Comparative Examples 2 to 3. The average temperature of the four corners of the silicone rubber sheet in Example 3 was 68° C., which was lower than those of the silicon rubber sheets in Comparative Examples 2 to 3. Moreover, as shown in FIG. 6, the temperature rise curves are close together. This means that the silicon rubber sheet transfers heat uniformly in the planar direction, and also cools early. In other words, the silicone rubber sheet has high heat diffusion properties. This phenomenon is observed, e.g., when the heat storage silicone rubber sheet in Example 3 is provided between a heat generating component and a case of a personal computer, and the case is used as a cooling plate. The case is not likely to be heated locally, and the entire case also is prevented from becoming hot. This can make the user feel comfortable.

Examples 4 to 10 and Reference Example 1

The surface treatment of the heat storage inorganic particles was studied. The surface treatment was performed in the following manner.

<Silane Coupling Treatment>

(1) The total amount of filler, a treatment agent, and one-half the amount of methanol were mixed and stirred for 5 minutes by a Henschel mixer.

(2) After all the mixture was scraped off, a treatment agent and the other half of methanol were added and stirred for 5 minutes.

(3) All the mixture was scraped off, and then stirred for 5 minutes.

(4) The resultant mixture was transferred to a vat and heat treated at 100° C. for 1 hour by a circulating hot air oven.

<Titanate Coupling Treatment>

(1) The total amount of filler, a treatment agent, and one-half the amount of heptane were mixed and stirred for 5 minutes by a Henschel mixer.

(2) After all the mixture was scraped off, a treatment agent and the other half of heptane were added and stirred for 5 minutes.

(3) All the mixture was scraped off, and then stirred for 5 minutes.

(4) The resultant mixture was transferred to a vat and heat treated at 120° C. for 1 hour by a circulating hot air oven.

No surface treatment was performed in Reference Example 1.

<Confirmation of Hardness of Rubber>

(1) Silicone Component

Two-part, room temperature curing (two-part RTV) silicone rubber was used as a silicone component. A base polymer component (component (A)), a crosslinking component (component (B)), and a platinum-based metal catalyst (component (C)) had previously been added to the two-part RTV silicone rubber.

(2) Heat Storage Inorganic Particles

The particles of vanadium dioxide ($VO_2$) with an average particle size of 20 μm were used. The latent heat of the vanadium dioxide ($VO_2$) particles produced during the electronic phase transition was 245 J/cc.

400 parts by mass of the $VO_2$ particles treated with a surface treatment agent (e.g., a silane coupling agent or a titanate coupling agent) were added to 100 parts by mass of the two-part RTV silicone rubber, and the mixture was kneaded for 5 minutes by a planetary mixer while removing foam. Subsequently, the mixture was poured on a polyethylene terephthalate (PET) film that had been subjected to a release treatment, was rolled to a thickness of 3 mm, and then was heat treated at 100° C. for 1 hour by a circulating hot air oven for curing. The hardness was confirmed and evaluated as follows.

A: The product thus formed was a rubber elastic body.

B: The product thus formed remained in a liquid state.

<Method for Measuring Viscosity>

The viscosity was measured at 25° C. and a shear rate of 1/s by a precision rotational viscometer "Roto Visco" (RV1).

Tables 3 and 4 show the results of Examples 4 to 10 and Reference Example 1 together. Comparing Examples 4 to 10 in which the surface treatment was performed and Reference Example 1 in which no surface treatment was performed, it was confirmed that the surface treatment of the VO$_2$ particles improved the curing rate of the compound. In Examples 7 and 8, the viscosity could not be measured, since the measuring terminal came into contact with aggregates. As can be seen from Tables 3 to 4, the time required for the temperature to reach 85° C. from 30° C. was slow in Examples 4 to 10 compared to Reference Example 1, so that Examples 4 to 10 achieved high heat storage properties.

Examples 11 to 12 and Reference Examples 2 to 3

Next, the surface-treated heat storage inorganic particles used in the above experiments were combined with the heat conductive particles. The studies were conducted using the following materials. Table 5 shows the physical properties of the silicone rubber sheets thus formed.

Example 11

(1) Silicone Component
Two-part RTV silicone rubber was used as a silicone component.
(2) Heat Storage Inorganic Particles
The particles of vanadium dioxide (VO$_2$) were surface treated with a silane coupling agent. The vanadium dioxide (VO$_2$) particles were added in an amount of 200 parts by weight per 100 parts by weight of the silicone component, and uniformly mixed.
(3) Heat Conductive Particles
(a) Small-size Heat Conductive Particles
The small-size heat conductive particles were composed of alumina having an average particle size of 1 μm and were surface treated with a silane coupling agent. The amount of the small-size heat conductive particles added was 200 parts by weight per 100 parts by weigh of the silicone component.
(b) Middle-size Heat Conductive Particles
The middle-size heat conductive particles were composed of alumina with an average particle size of 3 μm and were surface treated with a silane coupling agent. The amount of the middle-size heat conductive particles added was 450 parts by weight per 100 parts by weight of the silicone component.
(c) Large-size Heat Conductive Particles
The large-size heat conductive particles included two types of particles as follows, both of which were not surface treated with a silane coupling agent and were used as they were.
(i) The particles of alumina with an average particle size of 50 μm were used. The amount of the particles added was 500 parts by weight per 100 parts by weight of the silicone component.
(ii) The particles of aluminum nitride with an average particle size of 50 μm were used. The amount of the particles added was 200 parts by weight per 100 parts by weight of the silicone component.

Example 12

(1) Silicone Component
Two-part RTV silicone rubber was used as a silicone component.
(2) Heat Storage Inorganic Particles
The particles of vanadium dioxide (VO$_2$) were surface treated with a silane coupling agent. The vanadium dioxide (VO$_2$) particles were added in an amount of 200 parts by weight per 100 parts by weight of the silicone component, and uniformly mixed.

(3) Heat Conductive Particles
(a) Middle-size Heat Conductive Particles
The middle-size heat conductive particles were composed of alumina with an average particle size of 3 μm and were surface treated with a silane coupling agent. The amount of the middle-size heat conductive particles added was 200 parts by weight per 100 parts by weight of the silicone component.
(b) Large-size Heat Conductive Particles
The large-size heat conductive particles were composed of alumina with an average particle size of 50 μm. The amount of the large-size heat conductive particles added was 200 parts by weight per 100 parts by weight of the silicone component.

Reference Example 2

Reference Example 2 was the same as Example 11 except that the VO$_2$ particles were not surface treated with a silane coupling agent.

Reference Example 3

Reference Example 3 was the same as Example 12 except that the VO$_2$ particles were not surface treated with a silane coupling agent.

TABLE 3

|  |  | Example | | |
| --- | --- | --- | --- | --- |
|  |  | Ex. 4 | Ex. 5 | Ex. 6 |
| Silicone rubber | two-part RTV | 100 | 100 | 100 |
| Heat storage particles | VO$_2$ | 400 | 400 | 400 |
| Silane coupling agent | methyltrimethoxysilane | 0.37 | | |
|  | hexyltrimethoxysilane | | 0.57 | |
|  | octyltriethoxysilane | | | 0.76 |
|  | 2-(3,4-Epoxycyclohexyl)ethyltrimethoxysilane | | | |
|  | 3-Isocyanatopropyltriethoxysilane | | | |
|  | γ-Aminopropyltriethoxysilane | | | |
| Titanate coupling agent | tetrabutyl titanate | | | |
| Diluting solvent | methanol | 0.74 | 1.14 | 1.52 |
|  | heptane | | | |
| Rubber hardness |  | A | A | A |
| Viscosity (Pas) |  | 36 | 37 | 42 |
| Heat conductivity (W/m · K) |  | 0.9 | 0.8 | 0.8 |
| Heat storage properties (time required for temperature rise from 30° C. to 85° C.: sec) |  | 719 | 682 | 634 |

TABLE 4

| Example, Comparative Example | | Ex. 7 | Ex. 8 | Ex. 9 | Ex. 10 | Ref. Ex. 1 |
|---|---|---|---|---|---|---|
| Silicone rubber | two-part RTV | 100 | 100 | 100 | 100 | 100 |
| Heat storage particles | $VO_2$ | 400 | 400 | 400 | 400 | 400 |
| Silane coupling agent | methyltrimethoxysilane | | | | | |
| | hexyltrimethoxysilane | | | | | |
| | octyltriethoxysilane | | | | | |
| | 2-(3,4-Epoxycyclohexyl)ethyltrimethoxysilane | 0.73 | | | | |
| | 3-Isocyanatopropyltriethoxysilane | | 0.68 | | | |
| | γ-Aminopropyltriethoxysilane | | | 0.61 | | |
| Titanate coupling agent | tetrabutyl titanate | | | | 0.93 | |
| Diluting solvent | methanol | 1.46 | 1.36 | 1.22 | | |
| | heptane | | | | 1.86 | |
| Rubber hardness | | A | A | A | A | B |
| Viscosity (Pas) | | *2 | *2 | 43 | 19 | 1.076 |
| Heat conductivity (W/m · K) | | 0.8 | 0.8 | 0.8 | 0.8 | 0.8 |
| Heat storage properties (time required for temperature rise from 30° C. to 85° C.: min) | | 704 | 685 | 704 | 659 | 606 |

Note
*2 The viscosity could not be measured, since the measuring terminal came into contact with aggregates.

Table 4 confirmed that, compared to Reference Example 1, the heat storage compositions in Examples 7 to 10 were stable without inhibiting the curing, and thus had high heat storage properties.

TABLE 5

| | | Example, Comparative Example | | | |
|---|---|---|---|---|---|
| | | Ex. 11 | Ex. 12 | Ref. Ex. 2 | Ref. Ex. 3 |
| Silicone rubber | two-part RTV | 100 | 100 | 100 | 100 |
| Heat storage particles | $VO_2$ | 200 | 200 | 200 | 200 |
| Silane coupling agent | octyltriethoxysilane | 0.73 | 0.73 | | |
| Heat storage particles | Heat storage particles | 1350 | 400 | 1350 | 400 |
| Rubber hardness | | A | A | B | B |
| Heat conductivity (W/m · K) | | 5.0 | 1.5 | 5.0 | 1.5 |
| Heat storage properties (time required for temperature rise from 30° C. to 85° C.: sec) | | 754 | 681 | 736 | 621 |

As can be seen from Table 5, the curing was not inhibited, and the time required for the temperature to reach 85° C. from 30° C. was slow in Example 11 compared to Reference Example 2, so that Example 11 achieved higher heat storage properties. Moreover, the curing was not inhibited, and the time required for the temperature to reach 85° C. from 30° C. was slow in Example 12 compared to Reference Example 3, so that Example 12 achieved high heat storage properties.

Examples 13 to 14

The surface treatment of the heat storage inorganic particles was studied. The surface treatment was performed in the following manner.

<Silane Coupling Treatment>

(1) The total amount of filler, a treatment agent, and one-half the amount of methanol were mixed and stirred for 5 minutes by a Henschel mixer.

(2) After all the mixture was scraped off, a treatment agent and the other half of methanol were added and stirred for 5 minutes.

(3) All the mixture was scraped off, and then stirred for 5 minutes.

(4) The resultant mixture was transferred to a vat and heat treated at 120° C. for 1 hour by a circulating hot air oven.

<Confirmation of Hardness of Rubber>

(1) Silicone Component

Two-part, room temperature curing (two-part RTV) silicone rubber was used as a silicone component. A base polymer component (component (A)), a crosslinking component (component (B)), and a platinum-based metal catalyst (component (C)) had previously been added to the two-part RTV silicone rubber.

(2) Heat Storage Inorganic Particles

The heat storage particles in which part of vanadium of vanadium dioxide had been replaced by ruthenium were used. The latent heat temperature of the heat storage particles were changed from that of the vanadium dioxide particles used in Examples 1 to 12. Table 6 shows each composition, the latent heat temperature, and the amount of the latent heat together.

400 parts by mass of the heat storage particles treated with a silane coupling agent were added to 100 parts by mass of the two-part RTV silicone rubber, and the mixture was kneaded for 5 minutes by a planetary mixer while removing foam. Subsequently, the mixture was poured on a polyethylene terephthalate (PET) film that had been subjected to a release treatment, was rolled to a thickness of 3 mm, and then was heat treated at 100° C. for 1 hour by a circulating hot air oven for curing. The hardness was confirmed and evaluated as follows.

A: The product thus formed was a rubber elastic body.
B: The product thus formed remained in a liquid state.

<Method for Measuring Heat Conductivity>

The heat conductivity was measured with a Hot Disk method using a thermophysical properties analyzer TPA-501 (trade name) manufactured by Kyoto Electronics Manufacturing Co., Ltd.

<Heat Storage Evaluation Test>

FIG. 3 shows a heat storage evaluation test apparatus 10. A heat storage composition sheet 12 is placed on a ceramic heater 11, and an aluminum plate 13 is placed on the heat storage composition sheet 12. A thermocouple 14 is attached to the underside of the ceramic heater 11. A heat storage evaluation test was performed by measuring the time it takes for heat from the ceramic heater 11 to reach the thermocouple 14. Specifically, the evaluation test was performed by measuring the time it takes for the temperature of the thermocouple 14 to rise from 15° C. to 70° C. Each of the components is described in detail below.

(1) Ceramic heater 11 (25 mm long, 25 mm wide, and 1.75 mm thick) with applied power of 5 W.

(2) Heat storage composition sheet 12 (25 mm long, 25 mm wide, and 3 mm thick), in which a light coating of grease was applied to both sides of the sheet.

(3) Aluminum plate 13 (22.5 mm long, 22.5 mm wide, and 4 mm thick).

<Method for Measuring Viscosity>

The viscosity was measured at 25° C. and a shear rate of 1/s by a precision rotational viscometer "RotoVisco" (RV1).

Table 6 shows the results of Examples 13 to 14 together. In Table 6, the time required for the temperature to reach 75° C. from 15° C. was about the same as the time required for the temperature to reach 85° C. from 30° C. in Examples 4 to 10. Thus, it was confirmed that Examples 13 to 14 had the heat storage properties even if the heat storage temperature was changed.

TABLE 6

|  |  | Example | |
| --- | --- | --- | --- |
|  |  | Ex. 13 | Ex. 14 |
| Silicone rubber | Two-part, room temperature curing silicone rubber | 100 | 100 |
| Heat storage particles | Heat storage particles | 400 | 400 |
|  | Heat storage particles: composition V (atom %) | 0.9925 | 0.9699 |
|  | Heat storage particles: composition Ru (atom %) | 0.0075 | 0.0301 |
| Silane coupling agent | octyltriethoxysilane | 0.75 | 0.75 |
| Diluting solvent | methanol | 1.5 | 1.5 |
| Rubber hardness |  | A | A |
| Latent heat temperature (° C.) |  | 56 | 29 |
| Amount of latent heat (J/cc) |  | 229 | 171 |
| Heat conductivity (W/m · K) |  | 0.8 | 0.8 |
| Heat storage properties (time required for temperature rise from 15° C. to 70° C.: sec) |  | 627 | 573 |

As can be seen from Table 6, the curing was not inhibited, and the time required for the temperature to reach 70° C. from 15° C. was slow in Examples 13 to 14, so that Examples 13 to 14 achieved high heat storage properties.

INDUSTRIAL APPLICABILITY

The heat storage composition of the present invention can be applied to products in various forms such as sheet and putty.

DESCRIPTION OF REFERENCE NUMERALS

1 Heat resistance measuring apparatus
2 Top
3 Cooling plate
4 Sheet sample
5 Heater
6 Load cell
7 Heat insulator
8 Cylinder
10 Heat storage evaluation test apparatus
11 Ceramic heater
12 Heat storage composition sheet
13 Aluminum plate
14 Thermocouple
20 Heat storage silicone rubber sheet
21 Organopolysiloxane
22 Heat storage inorganic particle
23 Heat conductive large particle
24 Heat conductive small particle
30 Heat diffusion measuring apparatus
31 Ceramic heater
32 Silicone rubber sheet
33 Thermograph

The invention claimed is:

1. A heat storage composition comprising:
a matrix resin;
heat storage inorganic particles; and
heat conductive particles,
wherein the heat storage inorganic particles are composed of a material that undergoes an electronic phase transition and has a latent heat of 1 J/cc or more for the electronic phase transition,
an amount of the heat storage inorganic particles is 10 to 2000 parts by weight with respect to 100 parts by weight of the matrix resin,
an amount of the heat conductive particles is 100 to 2000 parts by weight with respect to 100 parts by weight of the matrix resin,
the heat conductive particles include inorganic particles with an average particle size of 2 μm or more and inorganic particles with an average particle size of less than 2 μm,
an amount of the inorganic particles with an average particle size of 2 μm or more is 50 wt % or more when a total amount of particles is 100 wt %,
a heat conductivity of the heat storage composition is 0.3 W/m·K or more, and
the heat storage composition is provided between a heat generating member and a heat dissipating member to transfer heat in a planar direction.

2. The heat storage composition according to claim 1, wherein the heat storage inorganic particles have an average particle size of 0.1 to 100 μm.

3. The heat storage composition according to claim 1, wherein the matrix resin is at least one resin selected from a thermosetting resin and a thermoplastic resin.

4. The heat storage composition according to claim 3, wherein the matrix resin is an organopolysiloxane.

5. The heat storage composition according to claim 1, wherein the heat conductive particles are surface treated with a silane compound or its partial hydrolysate, and the silane compound is expressed by $R(CH_3)_a Si(OR')_{3-a}$, where R represents an alkyl group having 1 to 20 carbon atoms, R' represents an alkyl group having 1 to 4 carbon atoms, and a is 0 or 1.

6. The heat storage composition according to claim 1, wherein the heat storage inorganic particles are surface treated with alkoxysilane or alkyl titanate.

7. The heat storage composition according to claim 6, wherein the alkoxysilane is a silane compound or its partial hydrolysate, and the silane compound is expressed by $R(CH_3)_a Si(OR')_{3-a}$, where R represents an alkyl group having 1 to 20 carbon atoms, R' represents an alkyl group having 1 to 4 carbon atoms, and a is 0 or 1.

8. The heat storage composition according to claim 6, wherein the alkyl titanate is tetrabutyl titanate.

9. The heat storage composition according to claim 6, wherein the surface treatment allows alkoxysilane or alkyl titanate to be held on the heat storage inorganic particles by adsorption or a chemical bond.

10. The heat storage composition according to claim 1, wherein the heat storage composition is formed into a sheet.

11. The heat storage composition according to claim 1, wherein the heat storage inorganic particles are metal oxide particles containing vanadium as a main metal component.

12. The heat storage composition according to claim 1, wherein the heat conductive particles are particles of at least one selected from alumina, zinc oxide, magnesium oxide, aluminum nitride, boron nitride, aluminum hydroxide, and silica.

* * * * *